(12) United States Patent
Peterson et al.

(10) Patent No.: US 12,004,328 B2
(45) Date of Patent: Jun. 4, 2024

(54) SYSTEMS AND METHODS FOR IMMERSION-COOLED DATACENTERS

(71) Applicant: Microsoft Technology Licensing, LLC, Redmond, WA (US)

(72) Inventors: Eric C. Peterson, Woodinville, WA (US); Martha Geoghegan Peterson, Woodinville, WA (US); Vaidehi Oruganti, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/351,209

(22) Filed: Jun. 17, 2021

(65) Prior Publication Data
US 2022/0408612 A1 Dec. 22, 2022

(51) Int. Cl.
*H05K 7/20* (2006.01)

(52) U.S. Cl.
CPC ......... *H05K 7/20809* (2013.01); *H05K 7/203* (2013.01); *H05K 7/20318* (2013.01); *H05K 7/20327* (2013.01); *H05K 7/20836* (2013.01)

(58) Field of Classification Search
CPC .............. H05K 7/203; H05K 7/20236; H05K 7/20772; H05K 7/20318; H05K 7/20327; H05K 5/067; H05K 7/20381; H05K 7/20281; H05K 7/208; H05K 7/20254; H05K 7/20263; H05K 7/20309; G06F 1/20; G06F 2200/201; F28D 1/02; F28D 1/0206; F28D 2021/0028; F28D 15/0233
USPC .......... 361/699, 700, 679.53, 715, 716, 702, 361/711, 748, 677, 689, 704, 719, 720, 361/752, 679.46; 165/80.4, 104.33, 165/104.21; 257/714, 715; 62/259.2
See application file for complete search history.

(56) References Cited

U.S. PATENT DOCUMENTS

| | | | | |
|---|---|---|---|---|
| 5,774,337 A | * | 6/1998 | Lee | ..................... H05K 9/0049 361/725 |
| 6,828,675 B2 | | 12/2004 | Memory et al. | |
| 7,724,517 B2 | * | 5/2010 | Attlesey | .................. G06F 1/181 361/720 |
| 7,957,132 B2 | | 6/2011 | Fried | |
| 8,250,877 B2 | | 8/2012 | Correa et al. | |
| 8,619,425 B2 | | 12/2013 | Campbell et al. | |

(Continued)

FOREIGN PATENT DOCUMENTS

| | | |
|---|---|---|
| CN | 207783378 U | 8/2018 |
| WO | 2021099768 A1 | 5/2021 |

OTHER PUBLICATIONS

Kauffman, et al., "Shrinking Data Center Size, Complexity, and Cost through Directed-Flow Liquid Immersion Cooling", In Proceedings of Open Compute Project Summit, Mar. 20, 2018, 17 Pages.

(Continued)

*Primary Examiner* — Mandeep S Buttar
(74) *Attorney, Agent, or Firm* — RAY QUINNEY & NEBEKER P.C.; Paul N. Taylor

(57) ABSTRACT

A thermal management system includes a server computer and a shell defining an immersion chamber. The shell contacts the server computer along a bottom side and lateral walls of the chamber, and the immersion chamber has an opening on a top side. The shell is connected to the server computer and a portion of the server computer defines at least a portion of the immersion chamber.

20 Claims, 7 Drawing Sheets

(56) References Cited

U.S. PATENT DOCUMENTS

| | | | |
|---|---|---|---|
| 8,922,998 B2* | 12/2014 | Campbell | H05K 7/20272 |
| | | | 361/689 |
| 9,049,800 B2 | 6/2015 | Shelnutt et al. | |
| 10,409,345 B2 | 9/2019 | Sato et al. | |
| 10,966,352 B2 | 3/2021 | Iyengar et al. | |
| 2007/0268669 A1* | 11/2007 | Attlesey | G06F 1/20 |
| | | | 257/E23.095 |
| 2009/0025907 A1* | 1/2009 | Wenger | F28D 15/0266 |
| | | | 165/80.3 |
| 2010/0226094 A1* | 9/2010 | Attlesey | H05K 7/20772 |
| | | | 361/699 |
| 2011/0103019 A1* | 5/2011 | Campbell | H05K 7/20772 |
| | | | 361/702 |
| 2013/0094146 A1* | 4/2013 | Tufty | H05K 7/20218 |
| | | | 361/699 |
| 2019/0357378 A1* | 11/2019 | Kolar | H05K 7/20327 |
| 2020/0305307 A1* | 9/2020 | Amos | H05K 7/20781 |
| 2020/0323100 A1 | 10/2020 | Chiu et al. | |
| 2021/0059079 A1* | 2/2021 | Keehn | H05K 7/203 |
| 2022/0264761 A1* | 8/2022 | Keehn | H05K 7/20318 |
| 2022/0408609 A1* | 12/2022 | Longhurst | H05K 7/20236 |

OTHER PUBLICATIONS

"International Search Report and Written Opinion Issued in PCT Application No. PCT/US22/028887", dated Sep. 2, 2022, 10 Pages.

\* cited by examiner

SYSTEMS AND METHODS FOR IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. The liquid working fluid can be maintained at a lower temperature by allowing vaporized fluid to rise out of the liquid. The vapor in the cooling liquid can adversely affect the cooling performance of the working fluid. The vapor can be condensed and returned to the immersion tank.

BRIEF SUMMARY

In some embodiments, a thermal management system includes a server computer and a shell defining an immersion chamber. The shell contacts the server computer along a bottom side and lateral walls of the chamber, and the immersion chamber has an opening on a top side. The shell is connected to the server computer and a portion of the server computer defines at least a portion of the immersion chamber.

In some embodiments, an immersion cooling system includes a collection tank with a collection area, a substrate having at least one heat-generating electronic component thereon, and a shell defining an immersion chamber. The shell contacts the server computer along a bottom side and lateral walls of the chamber, and the immersion chamber has an opening on a top side. The shell is connected to the server computer and a portion of the server computer defines at least a portion of the immersion chamber. The substrate and heat-generating component positioned in the collection tank and above the collection area.

In some embodiments, a method of thermal management of electronic components includes introducing a first amount of liquid working fluid to a liquid immersion bath in contact with a heat-generating component of a computing device, boiling at least a vaporized portion of the liquid working fluid with the heat-generating component, and removing a second amount of liquid working fluid less than the first amount.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a front schematic representation of an immersion cooling system, according to at least one embodiment of the present disclosure;

FIG. 3-2 is a side view of the immersion cooling system of FIG. 3-1;

FIG. 6-1 is a perspective view of an immersion cooling system with a series of server computer and shell assemblies, according to at least one embodiment of the present disclosure;

FIG. 6-2 is a front partial cross-sectional view of the immersion cooling system of FIG. 6-1;

DETAILED DESCRIPTION

The present disclosure relates generally to systems and methods for thermal management of electronic devices or other heat-generating components. Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the working fluid vaporizes, introducing vapor into the liquid of the working fluid.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a condenser to extract heat from the vapor of the working fluid. The condenser then condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system.

Figure 1:
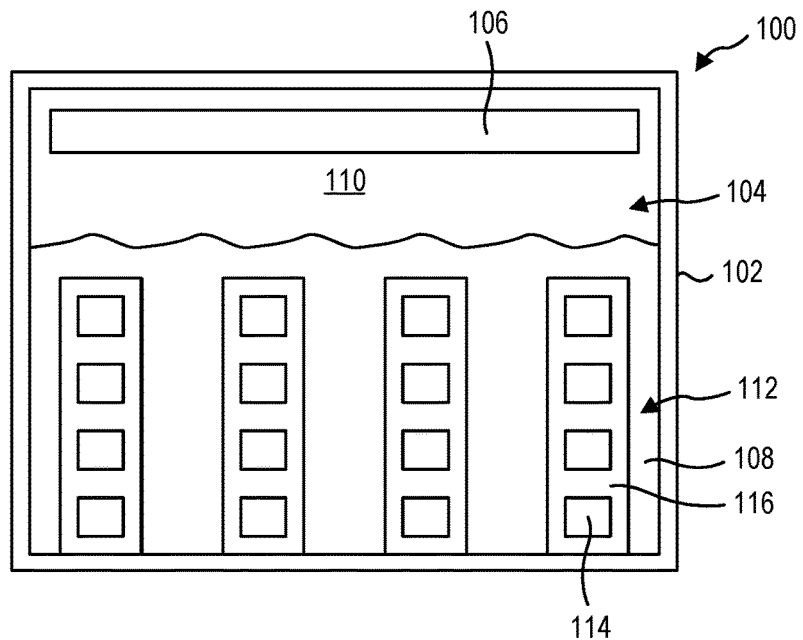
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
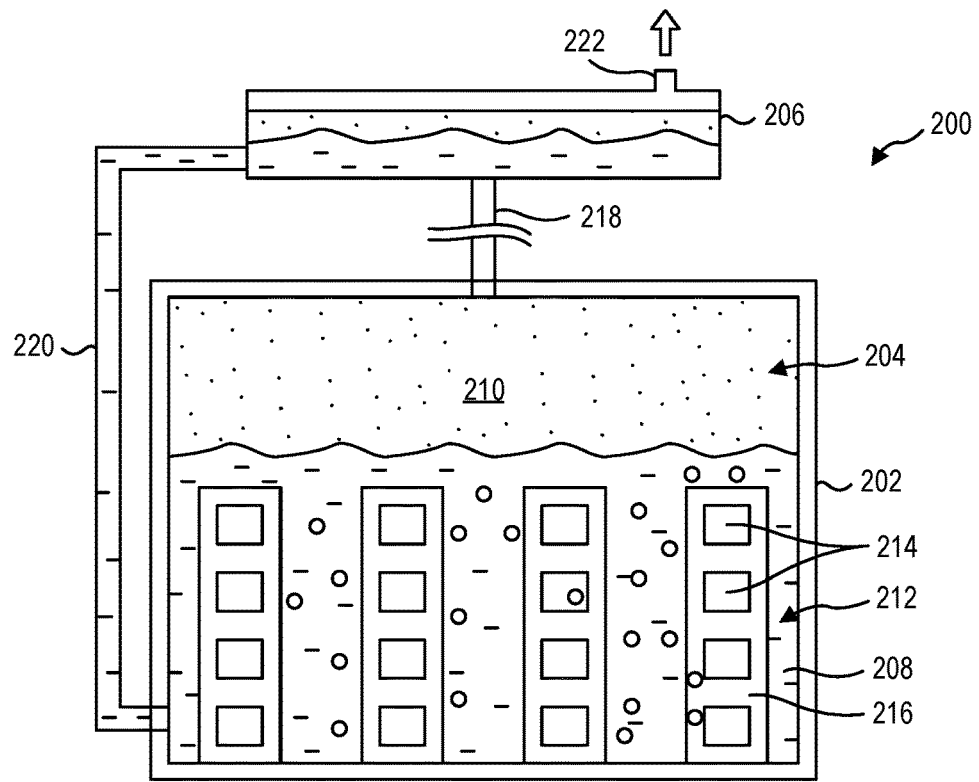
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air.

Figures 1, 3:
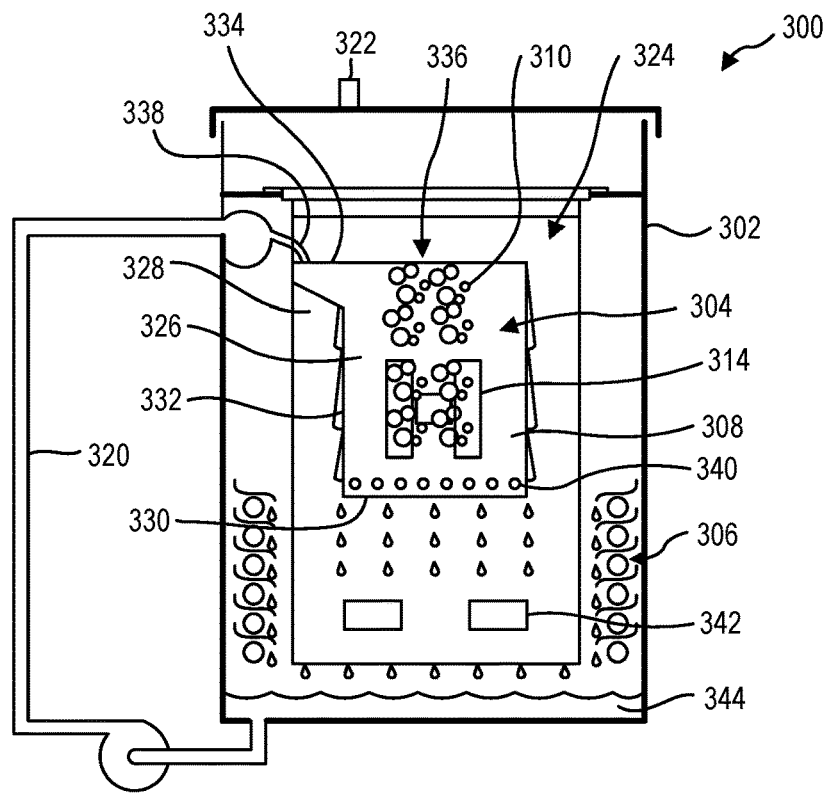
Figures 2, 3:
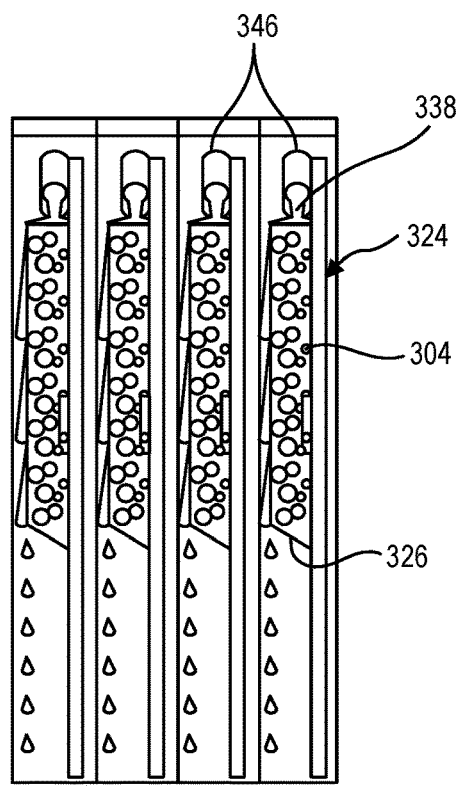

FIG. 3-1 is a schematic representation of an immersion cooling system 300 with localized immersion chambers 304 on a server computer 324 to capture and pool liquid working fluid 308 adjacent the greatest heat-generating components 314. Working fluid is recycled through the thermal management system, and, in some embodiments, the working fluid is a dielectric fluid or other fluid that is expensive. A thermal management system that uses less working fluid and/or uses the working fluid more efficiently allows for cost savings in the working fluid. In some embodiments, the working fluid is relatively dense and containing large volumes of the working fluid requires a strong container. Building and maintaining containers for large volumes and/or masses of working fluid can increase construction costs and container weight, which limits transport and maintenance of the containers.

In some embodiments according to the present disclosure, a shell 326 is attached to a server computer 324 or other electronic device to capture and pool the liquid working fluid 308 adjacent to at least one heat-generating component 314 of the server computer 324 in an immersion chamber 304. In some embodiments, the shell 326 is a stamped metal or polymer sheet. In some embodiments, the shell 326 is an injection molded sheet. The shell 326 may have planar or curved surfaces to define a portion of the immersion chamber 304. In some embodiments, the shell 326 defines a portion of a rectangular prism or box-shaped immersion chamber 304 around the heat-generating electronic components 314. In some embodiments, as will be described in relation to FIG. 5, at least a portion of the shell 326 is contoured to follow the shape of the heat-generating electronic components 314.

In some embodiments, the shell 326 contacts the server computer 324 or a substrate 328 of the server computer 324 along a bottom side 330 and lateral walls 332 of the immersion chamber 304 to collect the liquid working fluid 308. A top side 334 of the shell 326 has an opening 336 therein to the immersion chamber 304. The top side 334 of the shell 326 is the side, edge, or portion of the shell 326 that is oriented upward relative to a direction of gravity such that vapor working fluid 310 bubbles rise through the immersion chamber 304 toward the top side 334. In some embodiments, the opening 336 in the top side 334 allows the vapor working fluid 310 to exit the immersion chamber 304. In some embodiments, the top side 334 is a planar surface of the shell 326. In some embodiments, the top side 334 follows a top edge of the shell 326.

The opening 336 allows incoming liquid working fluid 338 to be introduced to the immersion chamber 304 and fill the immersion chamber 304 with liquid working fluid 308. In some embodiments, the incoming liquid working fluid 338 continuously fills the immersion chamber 304 to prevent a liquid level of the liquid working fluid 308 from falling below the heat-generating components 314. In some embodiments, the incoming liquid working fluid 338 continuously fills the immersion chamber 304 to prevent a liquid level of the liquid working fluid 308 from falling below the lowest part of the opening 336. For example, the incoming liquid working fluid 338 may continuously fill the immersion chamber 304 such that liquid working fluid spills out of the immersion chamber by overflowing the opening 326, leaking from a contact interface, exiting through one or more apertures or perforations 340, through a drain, or combinations thereof.

In some embodiments, a portion of the liquid working fluid 308 continuously overflows from the opening 336 as incoming liquid working fluid 338 flows into the immersion chamber 304 through the opening 336. A flow rate of the incoming liquid working fluid is at least greater than vaporization rate of the liquid working fluid in the immersion bath. In other words, more liquid working fluid mass is introduced into the immersion bath that is boiled by the heat-generating components, such that at least a portion of the liquid working fluid is displaced from the immersion bath by the incoming liquid working fluid.

In some embodiments, at least part of the liquid working fluid 308 flows out of the immersion bath 304 through one or more apertures, gaps, or perforations 340 in the lateral walls 332 and/or bottom side 330 of the immersion chamber 304. For example, a contact interface between the shell 326 and the server computer 324 may be not liquid tight, and allows at least a portion of the liquid working fluid 308 in the immersion chamber 304 to flow out of the immersion chamber 304 at the contact interface between the shell 326 and the substrate 328 of the server computer 324. In some embodiments, the shell 326 includes one or more perforations 340 through the shell 326, itself, that allows liquid working fluid 308 to leak through the perforations 340. In some embodiments, the shell 326 includes a drain that may be selectively opened or closed to adjust the volume of liquid cooling fluid overflowing from the opening of the immersion chamber.

As described herein, the incoming working fluid 338 may be colder than the liquid working fluid 308 in the immersion chamber 304, and the colder incoming working fluid 338 may cool the heat-generating components 314 more efficiently. Allowing at least a portion of the liquid working fluid to exit the immersion chamber through gaps, perforations, or drains in the shell or immersion chamber may allow greater mixing of the liquid working fluid in the immersion chamber, and, therefore, a lower average temperature of the liquid working fluid in the immersion chamber.

In some embodiments, a flow rate of the incoming liquid working fluid 338 is greater than vaporization rate of the liquid working fluid in the immersion bath and a flow rate of all liquid flow out of the immersion chamber other than overflow through the opening, such that the liquid level of the immersion chamber remains above the heat-generating components and/or at the lowest point of the opening.

The server computer 324 may have a plurality of heat-generating electronic components 314 affixed to a substrate 328, such as a motherboard. Some electronic components may consume more power and/or generate more heat than other components. The greatest heat-generating components 314 of the server computer 324 may be immersed in liquid working fluid 308, while lesser heat-generating components 342 may be cooled through ambient gas cooling (e.g., a fan blowing on the lesser heat-generating components) or through overflow liquid working fluid 308 flowing from the immersion chamber 304 defined by the shell 326.

The liquid working fluid introduced into the immersion chamber has a temperature less than the boiling temperature of the working fluid. When a portion of the working fluid overflows from the immersion chamber, the overflow liquid working fluid will still have an average temperature below the boiling temperature. The overflow liquid working fluid may then cool the lesser heat-generating components by absorbing heat from the lesser heat-generating components before boiling.

In some embodiments, the collection tank 302 includes condensers 306 positioned in the vapor space of the collection tank 302 above a liquid collection area 344. At least a portion of the condenser 306 may be positioned in the bottom half of the collection tank 302. In some embodiments, all of the coils 346 or cold plates of the condenser 306 may be positioned in the bottom half of the collection tank 302. In some embodiments, at least a portion of the condenser 306 may be below the opening in the immersion chamber defined by the shell. In some embodiments, all of the coils or cold plates of the condenser may be positioned in the bottom half of the collection tank below the opening in the immersion chamber defined by the shell.

Vapor working fluid 310 condensed by the condensers 306 falls to a collection area 344 in the bottom of the collection tank 302. The collection area 344 also collects the liquid working fluid 308 that is displaced from the immersion chamber 304. The collected liquid working fluid may be returned to the immersion chamber through a liquid return line 320. In some embodiments, the liquid working fluid may be further cooled while passing through the liquid return line 320 before re-entering the immersion chamber.

By lowering the condensers 306 in the collection tank 302, less headspace is required above the server computers, which reduces the size of the collection tanks needed to house the components. For example, the condensers can be move away from the lid, allowing the lid to be lighter and easier to remove to access the interior volume of the thermal management system. In at least one embodiment, the headspace above the heat-generating component 314 and/or the server computer 324 is less than the width of the collection tank 302. Conventional immersion cooling systems require a headspace above the components as much as 1.5 times the width of the tank.

In some embodiments, lowering the condensers in the collection tank allows the condensers to more efficiently condense the vapor working fluid. The vapor working fluid may be denser that non-condensable gases, such as nitrogen, that may enter the collection tank. The non-condensable gases can collect above the server computer(s) and the immersion tank(s) while the vapor working fluid settles lower in the collection tank. The condensers may be positioned in the area of the collection tank with a higher concentration of the vapor working fluid.

The presence of non-condensable gases can adversely affect the performance of the thermal management system, as the condensation of the vapor working fluid to a liquid working fluid lowers the pressure in the collection tank, helping to draw the incoming liquid working fluid into the collection tank. For example, the liquid working fluid may be over 100 times denser (i.e., take up less than $\frac{1}{100}^{th}$ of the volume) than vapor working fluid. In some embodiments, the non-condensable fluids separating into the headspace above the top of the immersion chambers and/or the server computers can allow the non-condensable gases to be vented, pumped, or otherwise purged from the collection tank more efficiently through a non-condensable gas vent 322.

In some embodiments, removing at least a portion of the server computers or other electronic devices from the immersion bath or collection bath can maintain a cleaner, and, therefore, more efficient, working fluid. For example, the elastomers found in electronic connectors, wires, cables, or other components can leach into the liquid working fluid more readily than into the vapor working fluid. The leached elastomers can adversely affect the thermal absorption efficiency of the working fluid, adversely affect the viscosity of the working fluid, adversely affect the boiling temperature of the working fluid, or cause the working fluid to leave a deposit on the heat-generating components, which can adversely affect the thermal transfer (e.g., cooling) from the heat-generating components.

In some embodiments, data connectivity may be improved by positioning the connectors of the server computer in a gaseous environment relative to a liquid environment. For example, optical connections, such as fiber optics, may perform better and/or more predictably in a gaseous environment relative to a liquid environment due to differences in the index of refraction between the optical fibers and the liquid environment.

In a conventional immersion tank, the liquid pressure increases as depth of the immersion bath increases. In conventional tanks and fluids, a depth of 1 meter results in a 2.3 pounds per square inch (PSI) increase. The increased pressure results in an increase in the boiling point for the working fluid and a resulting temperature increase of the components adjacent the working fluid at the bottom of the immersion bath. When separate immersion chambers are placed around heat-generating components, and/or the boards are oriented horizontally, the columnar pressure of the fluid around the component is reduced and produces lower operating temperatures for the component. In at least one example, a working fluid exhibits a 4° C. decrease in temperature relative to a component at a depth of 1 meter in a conventional immersion tank.

The incoming liquid working fluid is delivered by, in some embodiments, a manifold that directs the incoming liquid working fluid into the immersion chamber. In some embodiments, the incoming liquid working fluid is introduced through the opening in the top surface of the immersion chamber. In some embodiments, the incoming liquid working fluid is introduced through a port in shell, such as in the lateral wall of the immersion chamber. The incoming liquid working fluid may displace the liquid working fluid in the immersion chamber, at least partially, out the opening in the top.

FIG. 3-2 is a side view of the thermal management system of FIG. 3-1, illustrating a plurality of server computers 324 and shells 326 in series. The manifold 346 may provide incoming liquid working fluid 338 to each of the shells 326 and immersion chambers 304, individually. The individual immersion chamber 304 for each server computer 324 is a more efficient allocation of liquid working fluid while also providing modularity in the immersion cooling system for maintenance and repairs.

Figure 4:
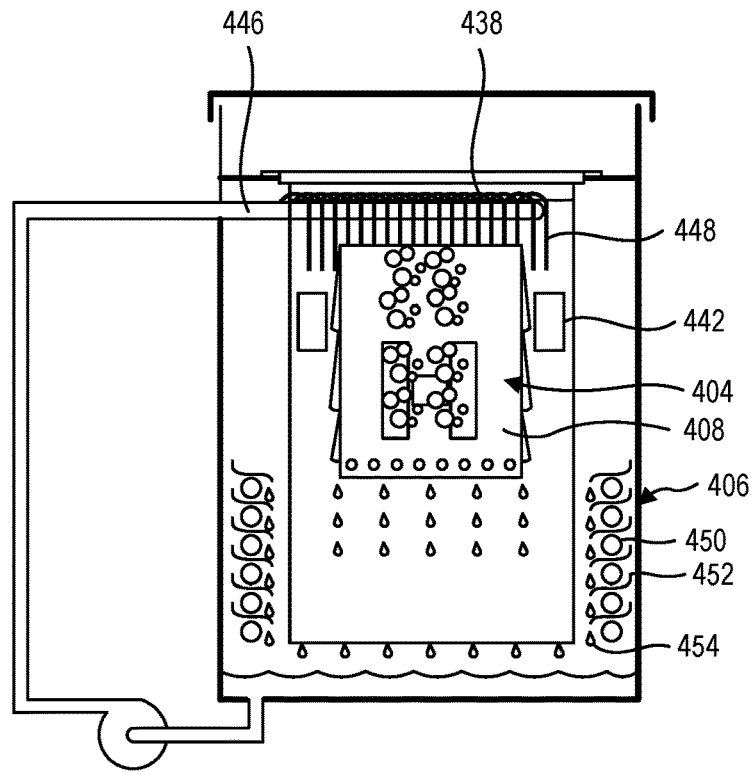
FIG. 4 is a front schematic representation of another immersion cooling system, according to at least one embodiment of the present disclosure.

FIG. 4 is a schematic representation of another embodiment of an immersion cooling system 400. In some embodiments, the manifold 446 can provide a plurality of streams 448 of incoming liquid working fluid 438 that are directed at the immersion chamber 404 to fill the immersion chamber 404. The plurality of streams 448 may allow for additional cooling on other lesser heat-generating components 442. The plurality of streams 448 may provide greater turbulence and mixing of the incoming liquid working fluid 438 with the liquid working fluid 408 in the immersion chamber to limit and/or prevent temperature gradients in the immersion chamber.

In some embodiments, the condenser 406 includes a plurality of cooling pipes 450 or cooling rods. The condenser 406 most efficiently cools and condenses vapor immediately adjacent to a surface of the pipes 450 or rods. In some embodiments, deflectors 452 are positioned below at least one of the pipes 450 or rods to catch condensate 454. The deflector 452 limits and/or prevents the condensate 454 from falling onto the pipe 450 or rod below, which would coat, and adversely affect the condensation efficiency of, the subsequent pipe 450 or rod.

In some embodiments, at least a portion of the heat-generating components in the immersion cooling system protrude above the immersion bath of liquid working fluid. Cooling of the heat-generating components may be assisted by the spraying of liquid working fluid toward and/or above the heat-generating components. In some embodiments, a fluid conduit carries liquid working fluid from the collection bath or other reservoir of liquid working fluid to at least one nozzle, such as on the manifold 446 described herein. The liquid working fluid is ejected from the nozzle(s) in droplets toward an immersion chamber and/or other components of the server computers.

The nozzles may be configured and/or sized to produce droplets of a desired diameter. The nozzles may be adjustable to vary the size of the droplets depending upon desired flowrate through the nozzles and the desired droplet size. In some embodiments, the nozzles create a plurality of droplets with an average droplet diameter of less than 1 millimeter. In some embodiments, the nozzles create a plurality of droplets with an average droplet diameter of less than 0.5 millimeters. In some embodiments, the nozzles create a plurality of droplets with an average droplet diameter of less than 0.25 millimeters. In some embodiments, the nozzles create a plurality of droplets with an average droplet diameter of less than 0.1 millimeters. In some embodiments, the nozzles sprays the subcooled working fluid onto another component, such as a fan, which further disrupts the surface tension and creates the droplets and/or more droplets to introduce the liquid working fluid to the server computers.

Figure 5:
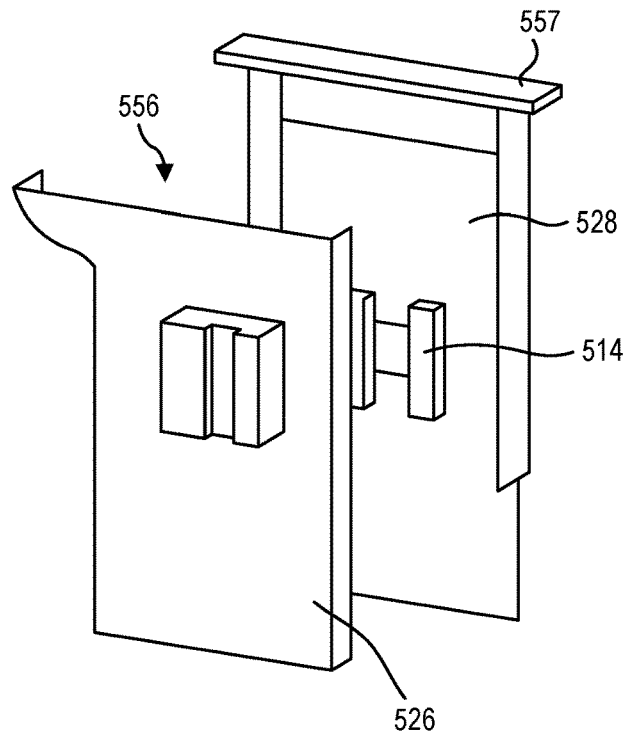
FIG. 5 is an exploded perspective view of a server computer and shell assembly, according to at least one embodiment of the present disclosure.

To further improve efficiency of working fluid allocation, in some embodiments, the shell is complementarily shaped to a topography of at least one heat-generating component, such as illustrated in FIG. 5. For example, the heat-generating components 514 may protrude from the substrate 528 by different degrees, such as a memory module protruding farther than a processor. In some embodiments, the shell 526 is complementarily shaped to the heat-generating components 514 to maintain a substantially constant distance from the heat-generating components 514 and, therefore, a substantially constant amount of liquid working fluid around the heat-generating components 514. In some embodiments, the shell 526 includes a vapor direction feature on an inner surface 556 thereof to collect and direct the vapor bubbles around or through the heat-generating components 514 to reduce dryout as the vapor bubbles rise through the immersion chamber.

The shell 526 may be supported against or adjacent to the server computer and/or substrate 528 by a frame 557. In some embodiments, the frame 557 is a chassis of the server computer. In some embodiments, the frame 557 is supported by or supports the chassis of the server. In some embodiments, the frame 557 defines at least part of the immersion chamber, such as a lateral wall of the immersion chamber.

Figures 1, 6:
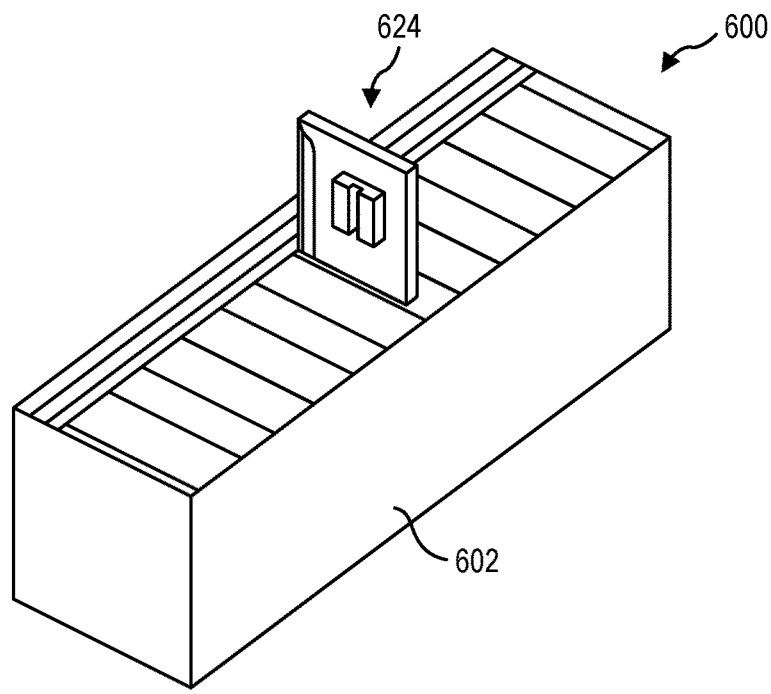
Figures 2, 6:
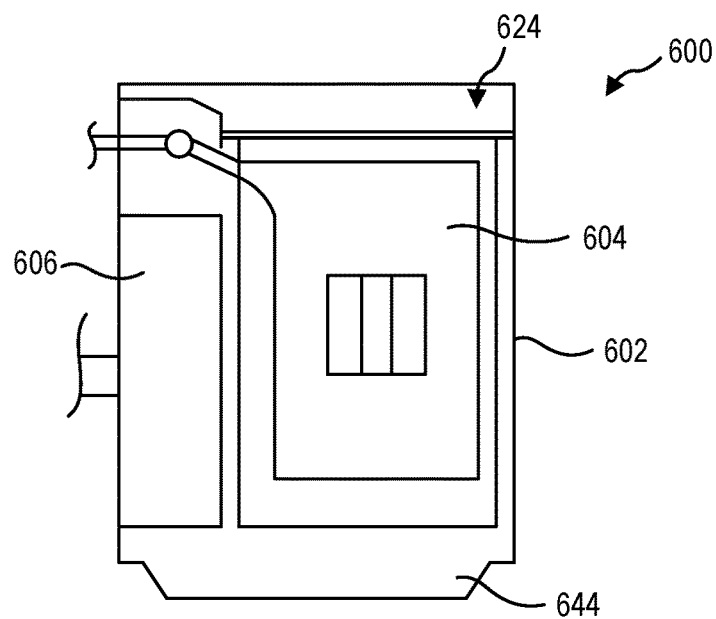

FIG. 6-1 and FIG. 6-2 are a perspective view and an end view, respectively, of an immersion cooling system 600 with a series of server computers 624 in a collection tank 602. Collecting liquid working fluid adjacent to each server computer 624 in a rack or collection tank 602 simplifies maintenance and/or modifications to the server array. In a conventional immersion cooling system, the entire immersion tank may be drained to access a component. In a conventional immersion cooling system, removing one server computer or other component removes volume from the immersion tank, lower the liquid level of the immersion bath, which may expose other components to a reduction in cooling capacity. An immersion cooling system 600 according to the present disclosure allows each server computer 624 to have discrete immersion chambers for each server computer, allowing the cooling of each server computer to be independent of the presence or removal of other components or computers.

A reduction in liquid working fluid mass, and liquid working fluid level in the collection tank, reduces the hydrostatic pressure against the walls of the immersion chamber. For example, replacing the liquid working fluid in the tank with vapor working fluid may reduce the pressure on the collection tank 602 by over 100 times, allowing for lighter, smaller, and cheaper tanks to be used. In some embodiments, the working fluid is 1.8 times to 2.0 times denser than water. Less working fluid mass means less hydrostatic pressure and less likelihood of leaks or other failures of the collection tank 602.

Referring now to FIG. 6-2, in some embodiments, the condenser 606 is positioned on a bottom or a side of the collection tank 602. Because the liquid level of the collection area 644 is lower than the server computers 624 and the immersion chambers 604, the server computers 624 can be accessed and/or removed from the collection tank 602 through a top of the collection tank 602 without moving or turning off the condenser 606. In some embodiments, the liquid working fluid can continue cycling through the liquid return line and through the manifold even while one or more server computer and shell assemblies is removed or replaced, reducing downtime and preventing the need for virtual machine migration.

Figure 7:
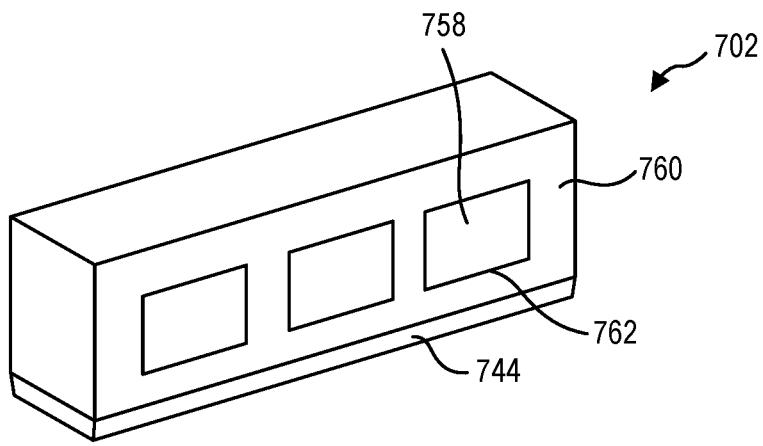
FIG. 7 is perspective view of a collection tank, according to at least one embodiment of the present disclosure.

While vertical access to the server computer and/or thermal management system is possible from the top with some embodiments of the present disclosure, some embodiments of collection tanks allow access to the collection tank, server computers, connectors, other components, or combinations thereof through a front or side surface of the collection tank, such as illustrated in FIG. 7. For example, one or more movable or removable access panels 758 in a side wall 760 of the collection tank 702 may have a bottom edge 762 that is higher that a liquid level of the collection area 744 at the bottom of the collection tank 702. In some embodiments, the bottom edge 762 of the access panel 758 may be higher than the liquid level to retain the relatively dense vapor working fluid in the collection tank 702.

Figure 8:
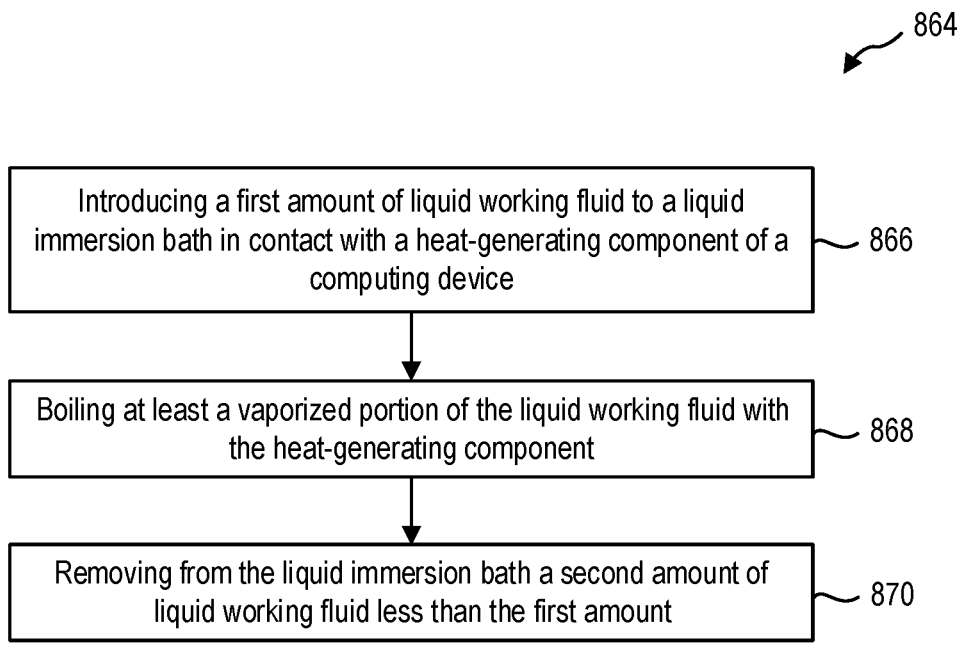
FIG. 8 is a flowchart illustrating a method of thermal management, according to at least one embodiment of the present disclosure.

Various embodiments and arrangements of components may be used to perform thermal management using a continuous flooding of liquid working fluid. FIG. 8 illustrates a method of thermal management. In some embodiments, a method 864 of thermal management according to the present disclosure includes introducing a first amount of liquid working fluid to a liquid immersion bath in contact with a heat-generating component at 866 and boiling at least a vaporized portion of the liquid working fluid with the heat-generating component at 868. The liquid working fluid absorbs heat from the heat-generating components and increases in temperature until reaching the boiling temperature. The liquid working fluid absorbs heat to exceed the latent heat needed to transition states to a gas.

While a vaporized portion of the working fluid transitions to a vapor and rises out of the liquid immersion bath from around the heat-generating components, another portion of the liquid working fluid in the immersion bath is removed from the immersion bath. In some embodiments, the method includes removing from the liquid immersion bath a second amount of liquid working fluid less than the first amount that is introduced into the liquid immersion bath at 870. By removing the second amount of liquid working fluid from the immersion bath while introducing the first amount, the immersion bath cycles liquid working fluid. In some embodiments, the incoming liquid working fluid is colder than the outgoing liquid working fluid, lowering the temperature of the immersion bath.

In some embodiments, the mass of the first amount of liquid working fluid is equal to the mass of the vaporized portion and the second amount of liquid working fluid. In some embodiments, the second amount is removed from the liquid immersion bath by at least one of overflow from an opening at the top of the immersion chamber, flow out of one or more contact interfaces between a shell and the computing device, flow out of one or more apertures or perforations in the shell or computing device, or through a drain that selectively opened or adjusted to control flow therethrough.

The method may further include directing the second amount of the liquid working fluid toward or onto other heat-generating components. In some embodiments, a shell and/or computing device that define an immersion chamber includes fluid direction features to control the flow or overflow of the liquid working fluid upon exiting the immersion chamber.

Figure 9:
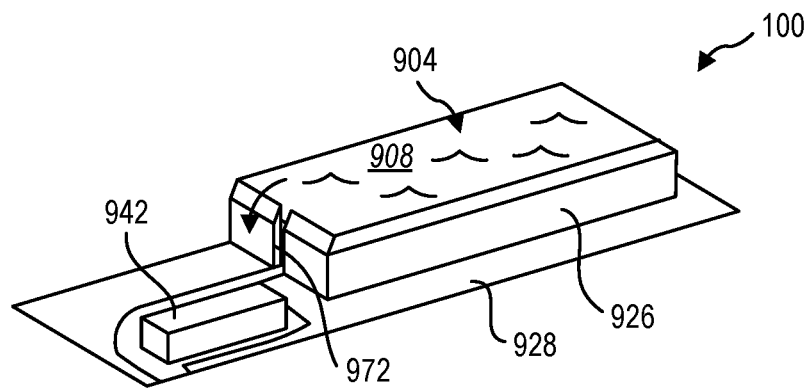
FIG. 9 is a perspective view of a horizontally oriented server computer and shell assembly, according to at least one embodiment of the present disclosure.

FIG. 9 is a perspective view of an embodiment of a horizontal server computer 924 with liquid working fluid 908 overflowing from the immersion chamber 904 and fluid direction features 972 to control flow of the liquid working fluid 908. While embodiments of vertically oriented server computers and shells have been described herein, in some embodiments, the substrate 928 of the server computer 924 and/or the shell 926 are oriented substantially horizontally. For example, the horizontal shell 926 may have a top side 934 (i.e., relative to a direction of gravity when positioned in a collection tank (such as collection tank 602 of FIGS. 6-1 and 6-2) with an opening 936 that is larger in area that a vertically oriented shell and server computer. The horizontal server computer and heat-generating component, in combination with a larger opening, allows the vapor to exit the immersion chamber more efficiently. The horizontal server computer and heat-generating component, in combination with a larger opening, may reduce dryout and increase cooling efficiency.

In some embodiments, the shell 926 includes at least one fluid direction feature 972, such as a channel, groove, notch, opening, fin, wall, slot, tunnel, or other structure integrated into or located on a surface of the shell 926. The fluid direction feature 972 influences the direction of the liquid working fluid 908 as the liquid working fluid 908 exits the immersion chamber 904. In some embodiments, a surface of the server computer 924 and/or substrate 928 of the server computer includes at least one fluid direction feature to further direct the liquid working fluid toward a heat-generating component 942 located outside of the immersion chamber 904.

In some embodiments, the fluid direction features direct flow from the immersion chamber to other heat-generating components of the server computer that are not in the immersion chamber. In some embodiments, the fluid direction features direct flow toward another server computer. For example, the flow or overflow of liquid working fluid from an immersion chamber may flow into an immersion chamber of another server computer to cascade the liquid working fluid. The first server computer may be positioned vertically above the second server computer to allow the liquid working fluid to flow from the immersion chamber of the first server computer to the immersion chamber of the second server computer.

Figure 10:
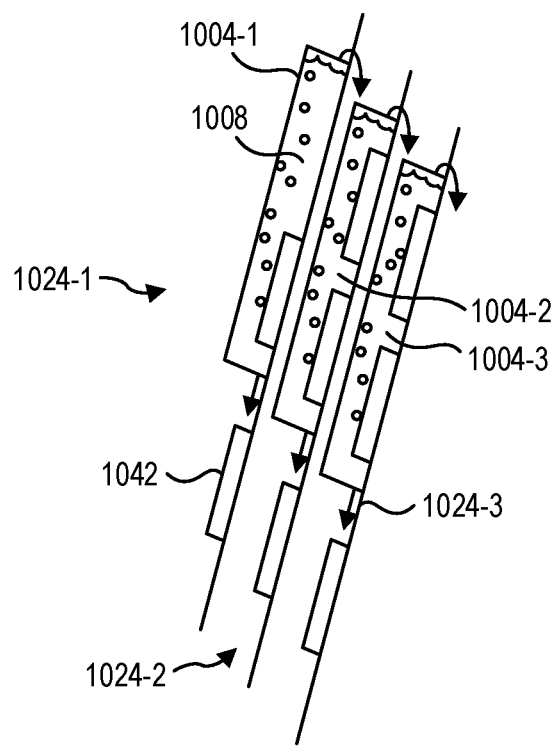
FIG. 10 is a side view of an immersion cooling system with angled server computer and shell assemblies, according to at least one embodiment of the present disclosure.

In at least one embodiment, the server computers 1024-1, 1024-2, 1024-3 may be oriented at an angle to gravity, as illustrated in FIG. 10, such as 5° or more relative to a vertical direction, to allow portion of the immersion chamber 1004-1 of the first server computer 1024-1 to be positioned above a portion of the immersion chamber 1004-2 of the second server computer 1024-2. In some embodiments, a first portion of the liquid working fluid 1008 that flows out of the immersion chamber 1004-1 cascades into another immersion chamber 1004-2, 1004-3 and a second portion of the liquid working fluid 1008 that flows out of the immersion chamber 1004-1 flows toward another heat-generating component 1042 of the server computer that is not in the immersion chamber to cool the heat-generating component 1042. In some embodiments, tilting the substrate and shell has the additional benefit of directing vapor bubbles away from the heat-generating components to reduce and/or prevent dryout.

Figure 11:
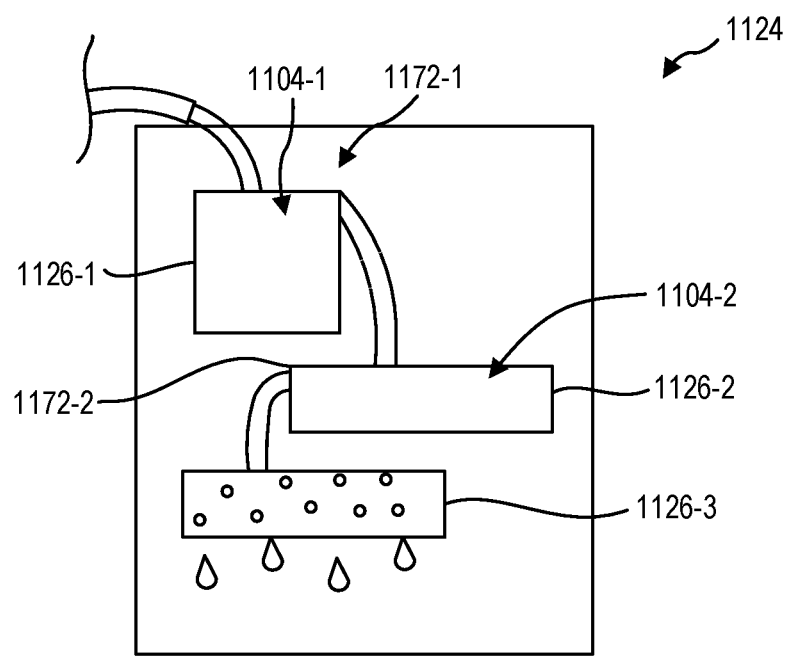
FIG. 11 is a front view of a server computer with a plurality of immersion chambers thereon with liquid working fluid cascading therebetween.

FIG. 11 is a side schematic view of a server computer 1124 with a plurality of shells 1126-1, 1126-2, 1126-3 connected thereto. In some embodiments, the fluid direction features 1172-1, 1172-2 direct flow or overflow from a first immersion chamber 1104-1 on a server computer to a second immersion chamber 1104-2 on the same server computer. The first immersion chamber and second immersion chamber may be part of the same shell connected to the substrate of the server computer. In other examples, the first immersion chamber is defined by a first shell and the substrate of the server computer, and the second immersion chamber is defined by a second shell and the substrate of the server computer.

The fluid direction features of each chamber direct flow or overflow into subsequent immersion chambers on the server computer. The immersion chambers may, therefore, slow the flow of the liquid working fluid in the region adjacent the greatest heat-generating components on the server computer while reducing the use of working fluid in locations where the additional cooling capacity is not needed.

INDUSTRIAL APPLICABILITY

The present disclosure relates generally to systems and methods for thermal management of electronic devices or other heat-generating components. Immersion chambers surround or partially surround the heat-generating components in a liquid working fluid, which conducts heat from the heat-generating components to cool the heat-generating components. As the working fluid absorbs heat from the heat-generating components, the temperature of the working fluid increases and the working fluid may vaporize, introducing vapor into the liquid of the working fluid. The vapor will rise due to buoyancy in the opposite direction of gravity, rising out of the liquid working fluid and entering a headspace above the liquid working fluid.

An immersion cooling system according to the present disclosure includes an immersion chamber with a working fluid positioned therein. The working fluid transitions between a liquid phase and a vapor phase to remove heat from hot or heat-generating components in the chamber. The liquid phase more efficiency receives heat from the components and, upon transition to the vapor phase, the working fluid can be cooled and condensed to extract the heat from the working fluid before the working fluid is returned to the liquid immersion bath at a lower temperature.

In some embodiments, the immersion bath of the liquid working fluid has a plurality of heat-generating components positioned in the liquid working fluid. The liquid working fluid surrounds the heat-generating components and other objects or parts attached to the heat-generating components. In some embodiments, the heat-generating components are positioned in the liquid working fluid on one or more supports. In some examples, the support is a motherboard of a computing device. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the working fluid may remove heat through convective cooling. In some embodiments, one or more of the heat-generating components includes a heat sink or other device attached to the heat-generating component to conduct away thermal energy and effectively increase the surface area of the heat-generating component.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor rises in the liquid working fluid, the vapor phase of the working fluid accumulates in an upper vapor region of the chamber. Conventionally, a condenser cools part of the vapor of the working fluid back into a liquid phase, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system. Conventionally, the condenser is positioned in a headspace above the liquid immersion bath to condense the vapor working fluid down into the immersion bath. This requires a large amount of volume and/or space above the immersion bath at or near a lid of the immersion tank.

In some embodiments, the heat-generating components are positioned in the liquid working fluid with at least a portion of the heat-generating components protruding from the liquid working fluid into the headspace. In some embodiments, the heat-generating components are completely submerged in the liquid working fluid. While submerging the heat-generating components may allow for efficiency thermal transfer to the liquid working fluid, the portion of the heat-generating components that protrudes into the headspace may allow for direct condensation and/or delivery of condensate on the heat-generating components.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

Working fluid is recycled through the thermal management system, and, in some embodiments, the working fluid is a dielectric fluid or other fluid that is expensive. A thermal management system that uses less working fluid and/or uses the working fluid more efficiently allows for cost savings in the working fluid. In some embodiments, the working fluid is relatively dense and containing large volumes of the working fluid requires a strong container. Building and maintaining containers for large volumes and/or masses of working fluid can increase construction costs and container weight, which limits transport and maintenance of the containers.

In some embodiments according to the present disclosure, a shell is attached to a server computer or other electronic device to capture and pool the liquid working fluid adjacent to at least one heat-generating component of the server computer in an immersion chamber. In some embodiments, the shell is a stamped metal or polymer sheet. In some embodiments, the shell is an injection molded sheet. The shell may have planar or curved surfaces to define a portion of the immersion chamber. In some embodiments, the shell defines a portion of a rectangular prism or box-shaped immersion chamber around the heat-generating electronic components. In some embodiments, at least a portion of the shell is contoured to follow the shape of the heat-generating electronic components.

In some embodiments, the shell contacts the server computer or a substrate of the server computer along a bottom side and lateral walls of the immersion chamber to collect the liquid working fluid. A top side of the shell has an opening therein to the immersion chamber. The top side of the shell is the side, edge, or portion of the shell that is oriented upward relative to a direction of gravity such that vapor working fluid bubbles rise through the immersion chamber toward the top side. In some embodiments, the opening in the top side allows the vapor working fluid to exit the immersion chamber. In some embodiments, the top side is a planar surface of the shell. In some embodiments, the top side follows a top edge of the shell.

The opening allows liquid working fluid to be introduced to the immersion chamber and fill the immersion chamber with liquid working fluid. In some embodiments, the incoming liquid working fluid continuously fills the immersion chamber to prevent a liquid level of the liquid working fluid from falling below the heat-generating components. In some embodiments, the incoming liquid working fluid continuously fills the immersion chamber to prevent a liquid level of the liquid working fluid from falling below the lowest part of the opening. For example, the incoming liquid working fluid may continuously fill the immersion chamber such that liquid working fluid spills out of the immersion chamber by overflowing the opening, leaking from a contact interface, exiting through one or more apertures or perforations, through a drain, or combinations thereof.

In some embodiments, a portion of the liquid working fluid continuously overflows from the opening as incoming liquid working fluid flows into the immersion chamber through the opening. A flow rate of the incoming liquid working fluid is at least greater than vaporization rate of the liquid working fluid in the immersion bath. In other words, more liquid working fluid mass is introduced into the immersion bath that is boiled by the heat-generating components, such that at least a portion of the liquid working fluid is displaced from the immersion bath by the incoming liquid working fluid.

In some embodiments, at least part of the liquid working fluid flows out of the immersion bath through one or more apertures, gaps, or perforations in the lateral walls and/or bottom side of the immersion chamber. For example, a contact interface between the shell and the server computer may be not liquid tight, and allows at least a portion of the liquid working fluid in the immersion chamber to flow out of the immersion chamber at the contact interface between the shell and the substrate of the server computer. In some embodiments, the shell includes one or more perforations through the shell, itself, that allows liquid working fluid to leak through perforations. In some embodiments, the shell includes a drain that may be selectively opened or closed to adjust the volume of liquid cooling fluid overflowing from the opening of the immersion chamber.

As described herein, the incoming working fluid may be colder than the liquid working fluid in the immersion chamber, and the colder incoming working fluid may cool the heat-generating components more efficiently. Allowing at least a portion of the liquid working fluid to exit the immersion chamber through gaps, perforations, or drains in the shell or immersion chamber may allow greater mixing of the liquid working fluid in the immersion chamber, and, therefore, a lower average temperature of the liquid working fluid in the immersion chamber.

In some embodiments, a flow rate of the incoming liquid is greater than vaporization rate of the liquid working fluid in the immersion bath and a flow rate of all liquid flow out of the immersion chamber other than overflow through the opening, such that the liquid level of the immersion chamber remains above the heat-generating components and/or at the lowest point of the opening.

The server computer may have a plurality of heat-generating electronic components affixed to a substrate, such as a motherboard. Some electronic components may consume more power and/or generate more heat than other components. The greatest heat-generating components of the server computer may be immersed in liquid working fluid, while lesser heat-generating components may be cooled through ambient gas cooling (e.g., a fan blowing on the lesser heat-generating components) or through overflow liquid working fluid flowing from the immersion chamber defined by the shell.

The liquid working fluid introduced into the immersion chamber has a temperature less than the boiling temperature of the working fluid. When a portion of the working fluid overflows from the immersion chamber, the overflow liquid working fluid will still have an average temperature below the boiling temperature. The overflow liquid working fluid may then cool the lesser heat-generating components by absorbing heat from the lesser heat-generating components before boiling.

In some embodiments, the tank includes condensers positioned in the vapor space of the tank above a liquid collection area. At least a portion of the condenser may be positioned in the bottom half of the collection tank. In some embodiments, all of the coils or cold plates of the condenser may be positioned in the bottom half of the collection tank. In some embodiments, at least a portion of the condenser may be below the opening in the immersion chamber defined by the shell. In some embodiments, all of the coils or cold plates of the condenser may be below the opening in the immersion chamber defined by the shell.

Vapor working fluid condensed by the condensers falls to a collection area in the bottom of the collection tank. The collection area also collects the liquid working fluid that is displaced from the immersion chamber. The collected liquid working fluid may be returned to the immersion chamber through a liquid return line. In some embodiments, the liquid working fluid may be further cooled while passing through the liquid return line before re-entering the immersion chamber.

By lowering the condensers in the collection tank, less headspace is required above the server computers, which reduces the size of the collection tanks needed to house the components. For example, the condensers can be move away from the lid, allowing the lid to be lighter and easier to remove to access the interior volume of the thermal management system.

In some embodiments, lowering the condensers in the collection tank allows the condensers to more efficiently condense the vapor working fluid. The vapor working fluid may be denser that non-condensable gases, such as nitrogen, that may enter the collection tank. The non-condensable gases can collect above the server computer(s) and the immersion tank(s) while the vapor working fluid settles lower in the collection tank. The condensers may be positioned in the area of the collection tank with a higher concentration of the vapor working fluid.

The presence of non-condensable gases can adversely affect the performance of the thermal management system, as the condensation of the vapor working fluid to a liquid working fluid lowers the pressure in the collection tank, helping to draw the incoming liquid working fluid into the collection tank. For example, the liquid working fluid may be over 100 times denser (i.e., take up less than $\frac{1}{100}^{th}$ of the volume) than vapor working fluid. In some embodiments, the non-condensable fluids separating into the headspace above the top of the immersion chambers and/or the server computers can allow the non-condensable gases to be vented, pumped, or otherwise purged from the collection tank more efficiently.

In some embodiments, removing at least a portion of the server computers or other electronic devices from the immersion bath or collection bath can maintain a cleaner, and, therefore, more efficient, working fluid. For example, the elastomers found in electronic connectors, wires, cables, or other components can leach into the liquid working fluid more readily than into the vapor working fluid. The leached elastomers can adversely affect the thermal absorption efficiency of the working fluid, adversely affect the viscosity of the working fluid, adversely affect the boiling temperature of the working fluid, or cause the working fluid to leave a deposit on the heat-generating components, which can adversely affect the thermal transfer (e.g., cooling) from the heat-generating components.

In some embodiments, data connectivity may be improved by positioning the connectors of the server computer in a gaseous environment relative to a liquid environment. For example, optical connections, such as fiber optics, may perform better and/or more predictably in a gaseous environment relative to a liquid environment due to differences in the index of refraction between the optical fibers and the liquid environment.

In a conventional immersion tank, the liquid pressure increases as depth of the immersion bath increases. In conventional tanks and fluids, a depth of 1 meter results in a 2.3 pounds per square inch (PSI) increase. The increased pressure results in an increase in the boiling point for the working fluid and a resulting temperature increase of the components adjacent the working fluid at the bottom of the immersion bath. When separate immersion chambers are placed around heat-generating components, and/or the boards are oriented horizontally, the columnar pressure of the fluid around the component is reduced and produces lower operating temperatures for the component. In at least one example, a working fluid exhibits a 4° C. decrease in temperature relative to a component at a depth of 1 meter in a conventional immersion tank.

The incoming liquid working fluid is delivered by, in some embodiments, a manifold that directs the incoming liquid working fluid into the immersion chamber. In some embodiments, the incoming liquid working fluid is introduced through the opening in the top surface of the immersion chamber. In some embodiments, the incoming liquid working fluid is introduced through a port in shell, such as in the lateral wall of the immersion chamber. The incoming liquid working fluid may displace the liquid working fluid in the immersion chamber, at least partially, out the opening in the top.

The manifold may provide incoming liquid working fluid to each of the shells and immersion chambers, individually. The individual immersion chamber for each server computer is a more efficient allocation of working fluid while also providing modularity in the thermal management system for maintenance and repairs.

In some embodiments, the manifold can provide a plurality of streams of incoming liquid working fluid that are directed at the immersion chamber to fill the immersion chamber. The plurality of streams may allow for additional cooling on other lesser heat-generating components. The plurality of streams may provide greater turbulence and mixing of the incoming liquid working fluid with the liquid working fluid in the immersion chamber to limit and/or prevent temperature gradients in the immersion chamber.

In some embodiments, the condenser includes a plurality of cooling pipes or cooling rods. The condenser most efficiently cools and condenses vapor immediately adjacent to a surface of the pipes or rods. In some embodiments, deflectors are positioned below at least one of the pipes or rods to catch condensate. The deflector limits and/or prevents the condensate from falling onto the pipe or rod below, which would coat, and adversely affect the condensation efficiency of, the subsequent pipe or rod.

In some embodiments, at least a portion of the heat-generating components in the immersion cooling system protrude above the immersion bath of liquid working fluid. Cooling of the heat-generating components may be assisted by the spraying of liquid working fluid toward and/or above the heat-generating components. In some embodiments, a fluid conduit carries liquid working fluid from the collection bath or other reservoir of liquid working fluid to at least one nozzle, such as on the manifold described herein. The liquid working fluid is ejected from the nozzle(s) in droplets toward an immersion chamber and/or other components of the server computers.

The nozzles may be configured and/or sized to produce droplets of a desired diameter. The nozzles may be adjustable to vary the size of the droplets depending upon desired flowrate through the nozzles and the desired droplet size. In some embodiments, the nozzles create a plurality of droplets with an average droplet diameter of less than 1 millimeter. In some embodiments, the nozzles create a plurality of droplets with an average droplet diameter of less than 0.5 millimeters. In some embodiments, the nozzles create a plurality of droplets with an average droplet diameter of less than 0.25 millimeters. In some embodiments, the nozzles create a plurality of droplets with an average droplet diameter of less than 0.1 millimeters. In some embodiments, the nozzles sprays the subcooled working fluid onto another component, such as a fan, which further disrupts the surface tension and creates the droplets and/or more droplets to introduce the liquid working fluid to the server computers.

To further improve efficiency of working fluid allocation, in some embodiments, the shell is complementarily shaped to a topography of at least one heat-generating component. For example, the heat-generating components may protrude from the substrate by different degrees, such as a memory module protruding farther than a processor. In some embodiments, the shell is complementarily shaped to the heat-generating components to maintain a substantially constant distance from the heat-generating components and, therefore, a substantially constant amount of liquid working fluid around the heat-generating components. In some embodiments, the shell includes a vapor direction feature on an inner surface thereof to collect and direct the vapor bubbles around or through the heat-generating components to reduce dryout as the vapor bubbles rise through the immersion chamber.

The shell may be supported against or adjacent to the server computer and/or substrate by a frame. In some embodiments, the frame is a chassis of the server computer. In some embodiments, the frame is supported by or supports the chassis of the server. In some embodiments, the frame defines at least part of the immersion chamber, such as a lateral wall of the immersion chamber.

Collecting liquid working fluid adjacent to each server computer in a rack or collection tank simplifies maintenance and/or modifications to the server array. In a conventional immersion cooling system, the entire immersion tank may be drained to access a component. In a conventional immersion cooling system, removing one server computer or other component removes volume from the immersion tank, lower the liquid level of the immersion bath, which may expose other components to a reduction in cooling capacity. A thermal management system according to the present disclosure allows each server computer to have discrete immersion chambers for each server computer, allowing the cooling of each server computer to be independent of the presence or removal of other components or computers.

A reduction in liquid working fluid mass, and liquid working fluid level in the collection tank, reduces the hydrostatic pressure against the walls of the immersion chamber. For example, replacing the liquid working fluid in the tank with vapor working fluid may reduce the pressure on the collection tank by over 100 times, allowing for lighter, smaller, and cheaper tanks to be used. In some embodiments, the working fluid is 1.8 times to 2.0 times denser than water. Less working fluid mass means less hydrostatic pressure and less likelihood of leaks or other failures of the collection tank.

In some embodiments, the condenser is positioned on a bottom or a side of the collection tank. Because the liquid level of the collection area is lower than the server computers and the immersion chambers, the server computers can be accessed and/or removed from the collection tank through a top of the collection tank without moving or turning off the condenser. In some embodiments, the liquid working fluid can continue cycling through the liquid return line and through the manifold even while one or more server computer and shell assemblies is removed or replaced, reducing downtime and preventing the need for virtual machine migration.

While vertical access to the server computer and/or thermal management system is possible from the top with some embodiments of the present disclosure, some embodiments of collection tanks allow access to the collection tank, server computers, connectors, other components, or combinations thereof through a front or side surface of the collection tank. For example, one or more movable or removable access panels in a side wall of the collection tank may have a bottom edge that is higher that a liquid level of the collection bath at the bottom of the collection tank. In some embodiments, the bottom edge of the access panel may be higher than the liquid level to retain the relatively dense vapor working fluid in the collection tank.

Various embodiments and arrangements of components may be used to perform thermal management using a continuous flooding of liquid working fluid. In some embodiments, a method of thermal management according to the present disclosure includes introducing a first amount of liquid working fluid to a liquid immersion bath in contact with a heat-generating component and boiling at least a vaporized portion of the liquid working fluid with the heat-generating component. The liquid working fluid absorbs heat from the heat-generating components and increases in temperature until reaching the boiling temperature. The liquid working fluid absorbs heat to exceed the latent heat needed to transition states to a gas.

While a vaporized portion of the working fluid transitions to a vapor and rises out of the liquid immersion bath from around the heat-generating components, another portion of the liquid working fluid in the immersion bath is removed from the immersion bath. In some embodiments, the method includes removing from the liquid immersion bath a second amount of liquid working fluid less than the first amount that is introduced into the liquid immersion bath. By removing the second amount of liquid working fluid from the immersion bath while introducing the first amount, the immersion bath cycles liquid working fluid. In some embodiments, the incoming liquid working fluid is colder than the outgoing liquid working fluid, lowering the temperature of the immersion bath.

In some embodiments, the mass of the first amount of liquid working fluid is equal to the mass of the vaporized portion and the second amount of liquid working fluid. In some embodiments, the second amount is removed from the liquid immersion bath by at least one of overflow from an opening at the top of the immersion chamber, flow out of one or more contact interfaces between a shell and the computing device, flow out of one or more apertures or perforations in the shell or computing device, or through a drain that selectively opened or adjusted to control flow therethrough.

The method may further include directing the second amount of the liquid working fluid toward or onto other heat-generating components. In some embodiments, a shell and/or computing device that define an immersion chamber includes fluid direction features to control the flow or overflow of the liquid working fluid upon exiting the immersion chamber.

While embodiments of vertically oriented server computers and shells have been describe herein, in some embodiments, the substrate of the server computer and/or the shell are oriented substantially horizontally. For example, the horizontal shell may have a top surface with an opening that is larger in area that a vertically oriented shell and server computer. The horizontal server computer and heat-generating component, in combination with a larger opening, allows the vapor to exit the immersion chamber more efficiently. The horizontal server computer and heat-generating component, in combination with a larger opening, may reduce dryout and increase cooling efficiency.

In some embodiments, the shell includes at least one fluid direction feature, such as a channel, groove, notch, opening, fin, wall, slot, tunnel, or other structure integrated into or located on a surface of the shell. The fluid direction feature influences the direction of the liquid working fluid as the liquid working fluid exits the immersion chamber. In some embodiments, a surface of the server computer and/or substrate of the server computer includes at least one fluid direction feature to further direct the liquid working fluid toward a heat-generating component located outside of the immersion chamber.

In some embodiments, the fluid direction features direct flow from the immersion chamber to other heat-generating components of the server computer that are not in the immersion chamber. In some embodiments, the fluid direction features direct flow toward another server computer. For example, the flow or overflow of liquid working fluid from an immersion chamber may flow into an immersion chamber of another server computer to cascade the liquid working fluid. The first server computer may be positioned vertically above the second server computer to allow the liquid working fluid to flow from the immersion chamber of the first server computer to the immersion chamber of the second server computer.

In at least one embodiment, the server computers may be oriented at an angle to gravity, such as 5° or more relative to a vertical direction, to allow portion of the immersion chamber of the first server computer to be positioned above a portion of the immersion chamber of the second server computer. In some embodiments, a first portion of the liquid working fluid that flows out of the immersion chamber cascades into another immersion chamber and a second portion of the liquid working fluid that flows out of the immersion chamber flows toward another heat-generating component of the server computer that is not in the immersion chamber to cool the heat-generating component.

In some embodiments, the fluid direction features direct flow or overflow from a first immersion chamber on a server computer to a second immersion chamber on the same server computer. The first immersion chamber and second immersion chamber may be part of the same shell connected to the substrate of the server computer. In other examples, the first immersion chamber is defined by a first shell and the substrate of the server computer, and the second immersion chamber is defined by a second shell and the substrate of the server computer.

The fluid direction features of each chamber direct flow or overflow into subsequent immersion chambers on the server computer. The immersion chambers may, therefore, slow the flow of the liquid working fluid in the region adjacent the greatest heat-generating components on the server computer while reducing the use of working fluid in locations where the additional cooling capacity is not needed.

The present disclosure relates to systems and methods for cooling heat-generating components of a computer or computing device according to at least the examples provided in the sections below:

[A1] In some embodiments, a thermal management system includes a server computer and a shell defining an immersion chamber. The shell contacts the server computer along a bottom side and lateral walls of the chamber, and the immersion chamber has an opening on a top side. The shell is connected to the server computer and a portion of the server computer defines at least a portion of the immersion chamber.

[A2] In some embodiments, the server computer of [A1] includes a substrate, and the shell is connected to the substrate.

[A3] In some embodiments, the top side of [A1] or [A2] is parallel to the substrate.

[A4] In some embodiments, the server computer of any of [A1] through [A3] includes a heat-generating component, and the opening of the top side of the immersion chamber is vertically above the heat-generating component.

[A5] In some embodiments, a thermal management system of any of [A1] through [A4] includes a working fluid positioned in the immersion chamber. The working fluid fills the immersion chamber to the opening.

[A6] In some embodiments, the server computer of any of [A1] through [A5] includes a first heat-generating component and a second heat-generating component, and the first heat-generating component is in the immersion chamber and the second heat-generating component is outside of the immersion chamber.

[A7] In some embodiments, the server computer of any of [A1] through [A6] includes a heat-generating component and at least a portion of the shell is complementarily shaped to a topography of the heat-generating component.

[A8] In some embodiments, the shell of any of [A1] through [A7] has at least one fluid direction feature on an outer surface thereof.

[B1] In some embodiments, an immersion cooling system includes a collection tank with a collection area, a substrate having at least one heat-generating electronic component thereon, and a shell defining an immersion chamber. The shell contacts the server computer along a bottom side and lateral walls of the chamber, and the immersion chamber has an opening on a top side. The shell is connected to the server computer and a portion of the server computer defines at least a portion of the immersion chamber. The substrate and heat-generating component positioned in the collection tank and above the collection area.

[B2] In some embodiments, the immersion cooling system of [B1] includes a condenser positioned in the collection tank below the opening of the immersion chamber.

[B3] In some embodiments, the immersion cooling system of [B1] includes a condenser positioned in a bottom half of the collection tank.

[B4] In some embodiments, the immersion cooling system of any of [B1] through [B3] includes a manifold configured to receive liquid working fluid from the collection area and direct the liquid working fluid to the immersion chamber.

[B5] In some embodiments, the shell of [B4] is configured to connect to the manifold to receive the liquid working fluid.

[B6] In some embodiments, the manifold of [B4] is configured to direct the liquid working fluid into the opening of the immersion chamber.

[B7] In some embodiments, the immersion cooling system of any of [B1] through [B6] includes a non-condensable gas vent in the collection tank.

[B8] In some embodiments, a height of a headspace of the immersion cooling system of any of [B1] through [B7] is less than a width of the collection tank.

[C1] In some embodiments, a method of thermal management of electronic components includes introducing a first amount of liquid working fluid to a liquid immersion bath in contact with a heat-generating component of a computing device, boiling at least a vaporized portion of the liquid working fluid with the heat-generating component, and removing a second amount of liquid working fluid less than the first amount.

[C2] In some embodiments, at least part of the second amount of liquid working fluid of [C1] leaks out of the liquid immersion bath between a shell and a substrate.

[C3] In some embodiments, at least part of the second amount of liquid working fluid of [C1] or [C2] overflows from a top side of the shell.

[C4] In some embodiments, the method of any of [C1] through [C3] includes condensing the vaporized portion with a condenser below the liquid immersion bath.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising:
a server computer;
a working fluid in both a liquid phase and a vapor phase; and
a shell defining an immersion chamber, wherein the shell contacts the server computer along a bottom side and lateral walls of the chamber, and the immersion chamber has an opening on a top side such that at least a portion of the liquid phase of the working fluid overflows from the immersion chamber when filled above the lateral walls of the chamber and the vapor phase of the working fluid rises through the opening in the top side;
a collection tank including one or more condensers and a liquid collection area, and wherein the immersion chamber is located above the liquid collection area inside of the collection tank; and
wherein a portion of the server computer defines at least a portion of the immersion chamber.

2. The thermal management system of claim 1, wherein the server computer includes a substrate, and the shell is connected to the substrate.

3. The thermal management system of claim 2, wherein the top side is parallel to the substrate.

4. The thermal management system of claim 1, wherein the server computer includes a heat-generating component, and the opening of the top side of the immersion chamber is vertically above the heat-generating component.

5. The thermal management system of claim 1, further comprising a working fluid positioned in the immersion chamber and filling the immersion chamber to the opening.

6. The thermal management system of claim 1, wherein the server computer includes a first heat-generating component and a second heat-generating component, and the first heat-generating component is in the immersion chamber and the second heat-generating component is outside of the immersion chamber.

7. The thermal management system of claim 1, wherein the server computer includes a heat-generating component and at least a portion of the shell is complementarily shaped to a topography of the heat-generating component.

8. The thermal management system of claim 1, wherein the shell has at least one fluid direction feature on an outer surface thereof to direct fluid as it overflows from the immersion chamber.

9. An immersion cooling system comprising:
a collection tank with a collection area;
a substrate having at least one heat-generating electronic component thereon, the substrate and heat-generating component positioned in the collection tank and above the collection area;
a shell defining an immersion chamber, wherein the shell contacts the server computer along a bottom side and lateral walls of the chamber, and the immersion chamber has an opening on a top side such that fluid overflows from the immersion chamber when filled above the lateral walls of the chamber, and
wherein a portion of the server computer defines at least a portion of the immersion chamber.

10. The immersion cooling system of claim 9, further comprising a condenser positioned in the collection tank below the opening of the immersion chamber.

11. The immersion cooling system of claim 9, further comprising a condenser positioned in a bottom half of the collection tank.

12. The immersion cooling system of claim 9, further comprising a manifold configured to receive liquid working fluid from the collection area and direct the liquid working fluid to the immersion chamber.

13. The immersion cooling system of claim 12, wherein the shell is configured to connect to the manifold to receive the liquid working fluid.

14. The immersion cooling system of claim 12, wherein the manifold is configured to direct the liquid working fluid into the opening of the immersion chamber.

15. The immersion cooling system of claim 9, further comprising a non-condensable gas vent in the collection tank.

16. The immersion cooling system of claim 9, wherein a headspace above the heat-generating component is less than a width of the collection tank.

17. A method of thermal management comprising:
introducing a first amount of liquid working fluid to a liquid immersion bath in contact with a heat-generating component of the server computer of claim 1;
boiling at least a vaporized portion of the liquid working fluid with the heat-generating component; and
removing a second amount of liquid working fluid less than the first amount.

18. The method of claim 17, wherein at least part of the second amount leaks out between a shell and a substrate.

19. The method of claim 17, wherein at least part of the second amount overflows from a top side of a shell.

20. The method of claim 17, further comprising condensing the vaporized portion with a condenser below the liquid immersion bath.

* * * * *